(12) United States Patent
Shibata (10) Patent No.: US 6,620,652 B1
(45) Date of Patent: Sep. 16, 2003

(54) SEMICONDUCTOR DEVICE AND METHOD OF MAKING THE SAME

(75) Inventor: Kazutaka Shibata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/556,087

(22) Filed: Apr. 21, 2000

(30) Foreign Application Priority Data

Apr. 21, 1999 (JP) .............................. 11-113054

(51) Int. Cl.⁷ ................................................ H01L 71/44
(52) U.S. Cl. ..................... 438/119; 438/118; 438/124; 438/126; 438/127; 257/783; 257/782
(58) Field of Search ................................ 438/118, 119, 438/108, 124, 125, 126, 127; 257/778, 780, 782, 783

(56) References Cited

U.S. PATENT DOCUMENTS

| | | | | |
|---|---|---|---|---|
| 5,866,953 A | * | 2/1999 | Akram et al. | 257/778 |
| 5,918,113 A | * | 6/1999 | Higashi et al. | 438/118 |
| 6,133,637 A | * | 10/2000 | Hikita et al. | 257/778 |
| 6,204,564 B1 | * | 3/2001 | Miyata et al. | 257/778 |

FOREIGN PATENT DOCUMENTS

JP          9-22965          7/1993

* cited by examiner

*Primary Examiner*—Kevin M. Picardat
(74) *Attorney, Agent, or Firm*—Merchant & Gould P.C.

(57) ABSTRACT

A semiconductor device is provided which includes a semiconductor chip, a base member for mounting the chip, anisotropic conductive adhesive arranged between the chip and the base member, and a package for enclosing the chip and the adhesive. The chip is secured to the base member not only by the adhesive but also by the package.

16 Claims, 7 Drawing Sheets

SEMICONDUCTOR DEVICE AND METHOD OF MAKING THE SAME

BACKGROUND OF THE INVENTION

1. Field of the Invention

The present invention relates to a semiconductor device of the type which comprises a semiconductor chip attached to a substrate by anisotropic conductive adhesive. The present invention also relates to a method of making such a semiconductor device.

2. Description of the Related Art

Figure 8:
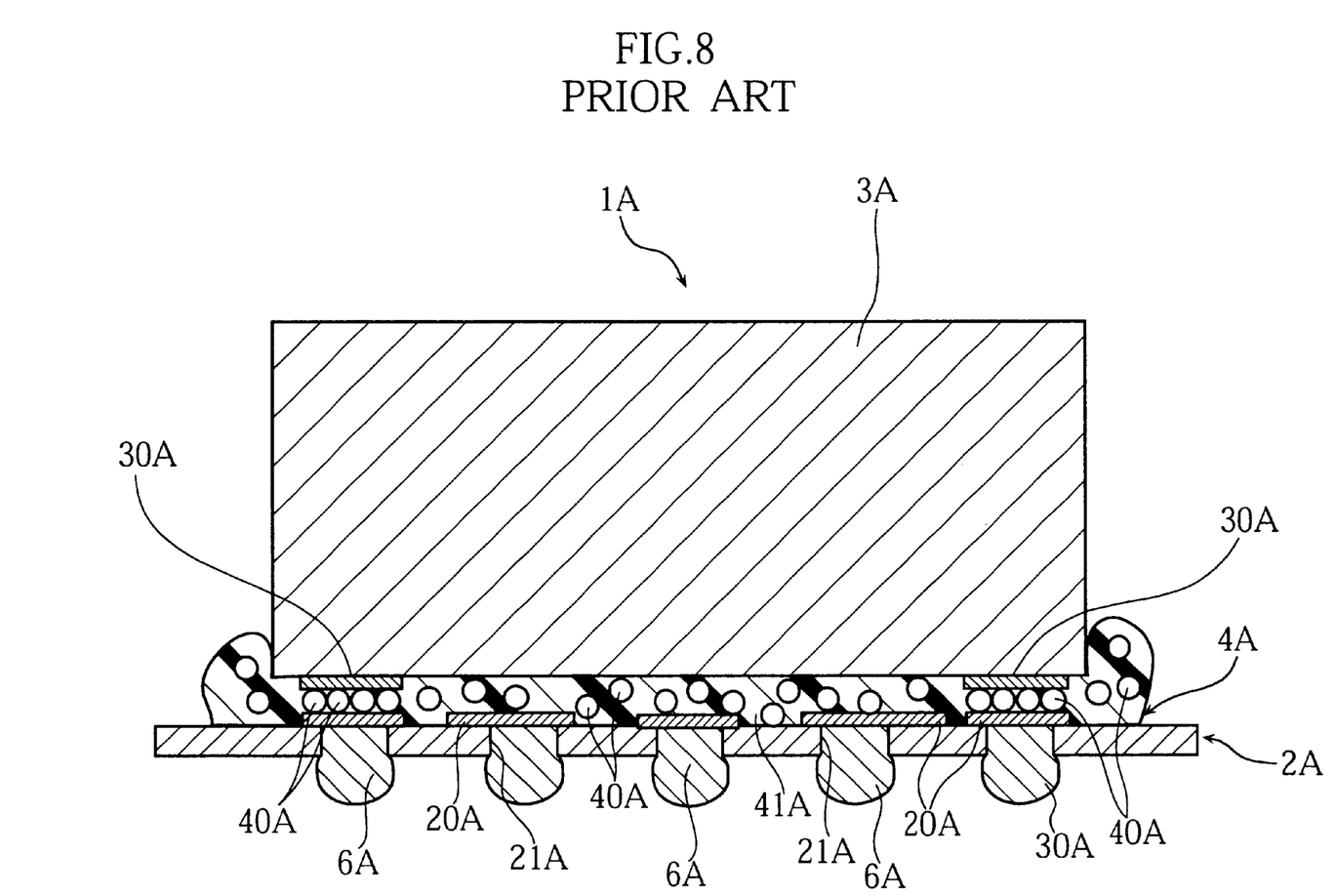
FIG. 8 is a sectional view showing a conventional semiconductor device.

FIG. 8 of the accompanying drawings shows an example of conventional semiconductor device, which is generally represented by reference sign 1A. The conventional device 1A includes an insulating substrate 2A and a semiconductor chip 3A mounted on the substrate 2A. The semiconductor chip 3A is bonded to the substrate 2A by an anisotropic conductive adhesive 4A. The illustrated adhesive 4A is made up of a thermosetting resin material 41A containing conductive substances 40A.

As illustrated, the semiconductor chip 3A is provided with connection terminals (conductive bumps) 30A, while the substrate 2A is provided with connection pads 20A. Each connection terminal 30A of the chip 3A is electrically connected to a corresponding one of the connection pads 20A on the substrate 2A via conductive substances 40A in the adhesive 4A. The semiconductor chip 3A is mechanically connected to the substrate 2A by the thermosetting resin material 41A in the adhesive 4A. The substrate 2A is formed with through-holes 21A corresponding in position to the connection pads 20A. Ball-like terminals 6A of solder are formed at the respective through-holes 6A to be electrically connected to the connection pads 20A.

As stated above, in the above conventional semiconductor device 1A, the mechanical bonding between the substrate 2A and the semiconductor chip 3A depends only on the thermosetting resin material 41A. Thus, disadvantageously, the semiconductor chip 3A may fail to be attached firmly to the substrate 2A. Consequently, the chip 3A may be accidentally detached from the substrate 2A rather easily upon application of an external force. Even if the chip 3A is only shifted in position relative to the substrate 2A, the device 1A may suffer from the short-circuiting of the wiring pattern.

SUMMARY OF THE INVENTION

The present invention has been proposed under the circumstances described above.

It is an object of the present invention to provide a semiconductor device in which a semiconductor chip is reliably attached to a base member.

Another object of the present invention is to provide a method of making such a semiconductor device.

According to a first aspect of the present invention, there is provided a semiconductor device which comprises a semiconductor chip, a base member for mounting the chip, anisotropic conductive adhesive arranged between the chip and the base member, and a package for enclosing the chip and the adhesive. The chip is secured to the base member by the adhesive and the package.

With such an arrangement, the chip is attached to the base member not only by the adhesive but also by the package. Thus, even if the bonding force of the adhesive is not strong enough, the package prevents the chip from being detached from the base member.

In a preferred embodiment, the package is held in direct contact with the base member.

The chip may be provided with at least one connection terminal, while the base member may be provided with at least one counterpart terminal held in facing relation to the connection terminal of the chip to be electrically connected thereto.

Preferably, the chip may have a bonding surface and side surfaces connected to the bonding surface. The adhesive may be held in contact with the bonding surface and a portion of each of the side surfaces.

Preferably, the base member may be an insulating substrate. The insulating substrate may be made of a glass-fiber-reinforced epoxy resin material or ceramic material for example.

Alternatively, the base member may comprise a film element having a bonding area reinforced for mounting the chip. It is possible to achieve the reinforcement of the bonding area by fixing a rigid plate, resin layer or wiring pattern to the bonding area.

In a preferred embodiment, the base member may comprise an additional semiconductor chip.

Preferably, the chip, the adhesive and the base member may be embedded in the package.

The conductive adhesive may comprise a thermosetting resin material containing conductive substances. This thermosetting resin material, before being caused to permanently set, is less rigid than a portion of the base member on which the chip is mounted.

Preferably, the package may be made of a thermosetting resin material which, prior to permanent setting, is less rigid than a portion of the base member on which the chip is mounted.

According to a second aspect of the present invention, there is provided a method of making a semiconductor device provided with a semiconductor chip, a base member and a protection package. The method may comprise the steps of: applying anisotropic conductive adhesive between the chip and the base member; provisionally attaching the chip to the base member by rendering the adhesive semi-solid; and forming the protection package to enclose the chip and the adhesive. The adhesive is rendered solid at the protection package forming step for securing the chip to the base member.

Preferably, the chip may be urged toward the base member by contraction of the protection package. The contraction may occur when the package solidifies and cools down.

Other features and advantages of the present invention will become apparent from the detailed description given below with reference to the accompanying drawings.

DETAILED DESCRIPTION OF THE PREFERRED EMBODIMENTS

The preferred embodiments of the present invention will be described below with reference to the accompanying drawings.

Figure 1:
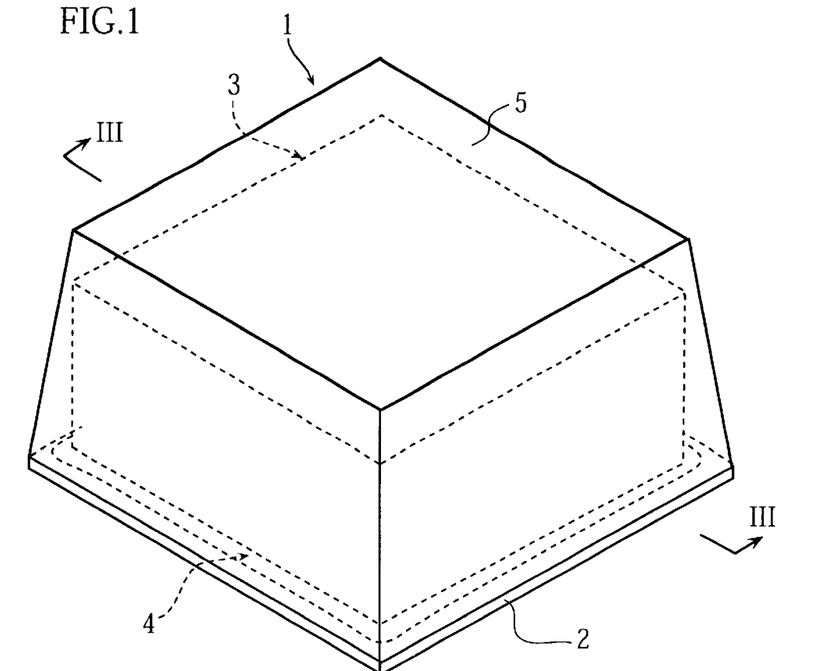
FIG. 1 is a perspective view showing a semiconductor device according to a first embodiment of the present invention.
Figure 2:
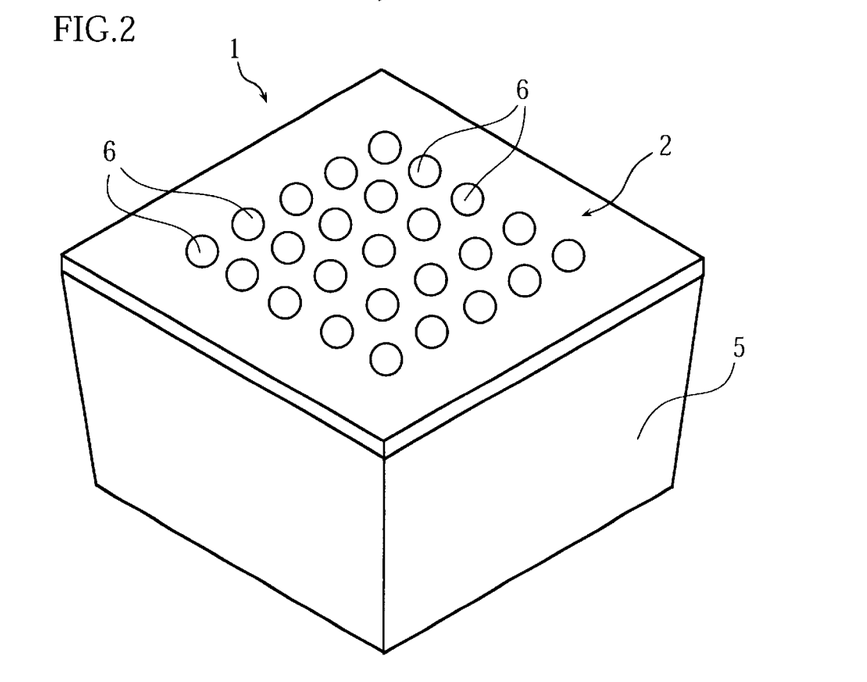
FIG. 2 is a perspective view showing the same semiconductor device turned over.
Figure 3:
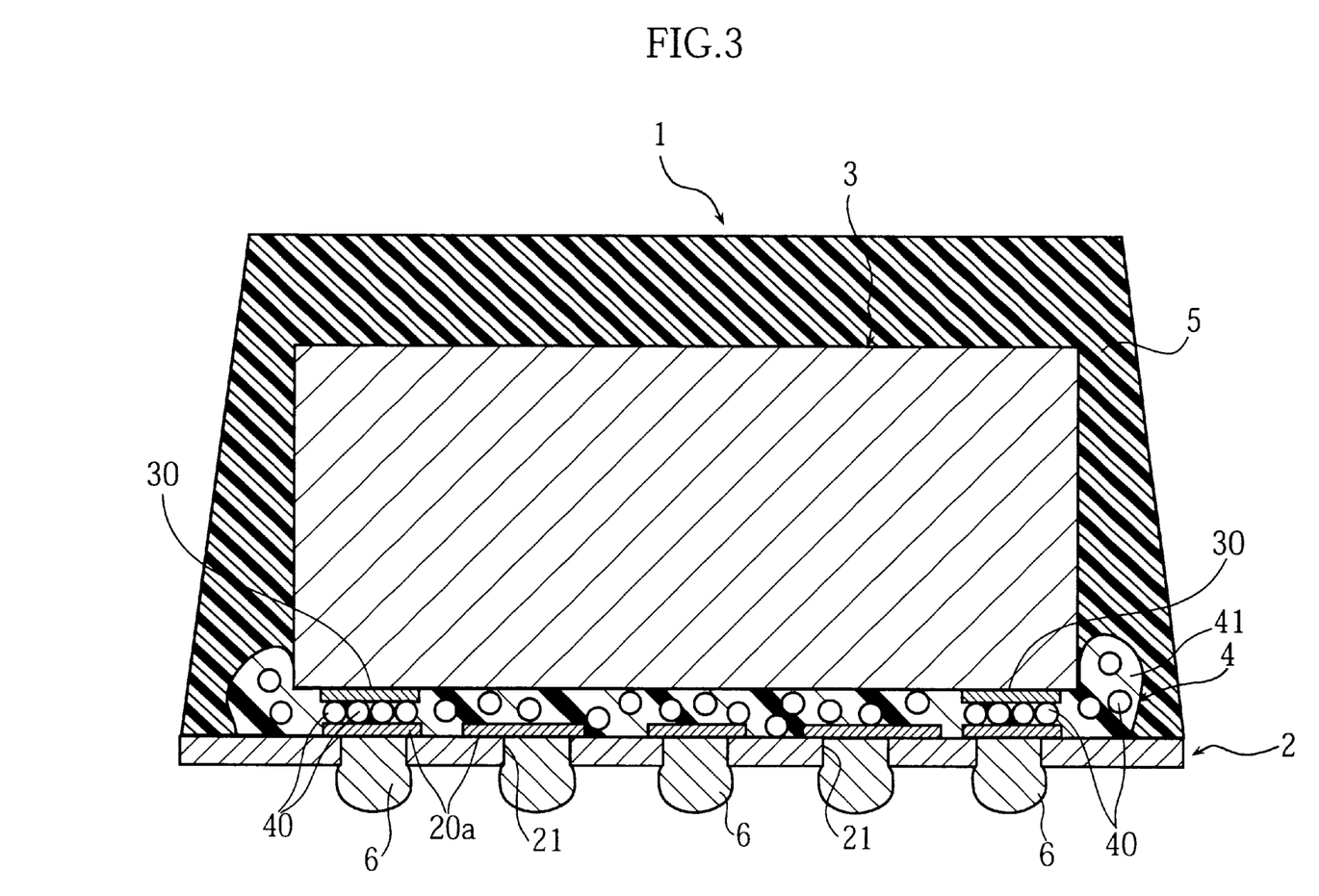
FIG. 3 is a sectional view taken along lines III—III in FIG. 1.

Reference is first made to FIGS. 1–3 illustrating a semiconductor device according to a first embodiment of the present invention. The illustrated semiconductor device, generally represented by reference numeral 1, includes an insulating substrate 2 and a semiconductor chip 3 mounted on the substrate 2. The chip 3 is bonded to the obverse surface of the substrate 2 by an anisotropic conductive adhesive 4. The semiconductor device 1 also includes a protection package 5 enclosing the chip 3 and the adhesive 4. The package 5 may be made of a thermosetting resin such as epoxy resin.

As shown in FIG. 3, a predetermined wiring pattern, which includes a plurality of connection pads 20a, is formed on the obverse surface of the substrate 2. Selected ones of the connection pads 20a are electrically connected to connection terminals 30 formed on the chip 3. The electrical connection between the pads 20a and the terminals 30 is established by conductive substances 40 dispersed in an insulating resin material 41 of the adhesive 4. The resin material 41, which serves to mechanically connect the chip 3 to the substrate 2, may be a thermosetting resin such as epoxy resin. In the illustrated embodiment, the conductive substances 40 are in the form of balls. The present invention, however, is not limited to this example. Each conductive substance 40 may have a needle-like or bar-like configuration.

The substrate 2 is formed with a plurality of through-holes 21 corresponding in position to the connection pads 20a. At each of the through-holes 21, a ball-like terminal 6 made of solder is formed on the reverse side of the substrate 2. Each of the ball-like terminals 6 is connected to a corresponding one of the connection pads 20a via a relevant through-hole 21. As shown in FIG. 2, the ball-like terminals 6 (hence the through-holes 21) are disposed in a grid-like array.

The insulating substrate 2 may be a plate made of a glass-fiber-reinforced resin or ceramic material. Alternatively, the substrate 2 may be a film element made of e.g. polyimide resin. Preferably, the substrate 2 needs to be more rigid than the thermosetting resin of the protection package 5 prior to permanent setting. Therefore, when a film-like base member is used in place of the essentially rigid substrate 2, the film-like member should be reinforced e.g. by subjecting the wiring pattern to thermal treatment such as quenching. Alternatively, a rigidity-improving layer may be formed on the film-like member, so that the total rigidity of the chip-supporting structure becomes greater than that of the semi-solid thermosetting resin of the protection package 5 in the making. It should be noted that the entirety of the film-like member is not necessarily reinforced. It may suffice to reinforce only a particular portion of the film-like member onto which the semiconductor chip 3 is mounted.

Figure 4:
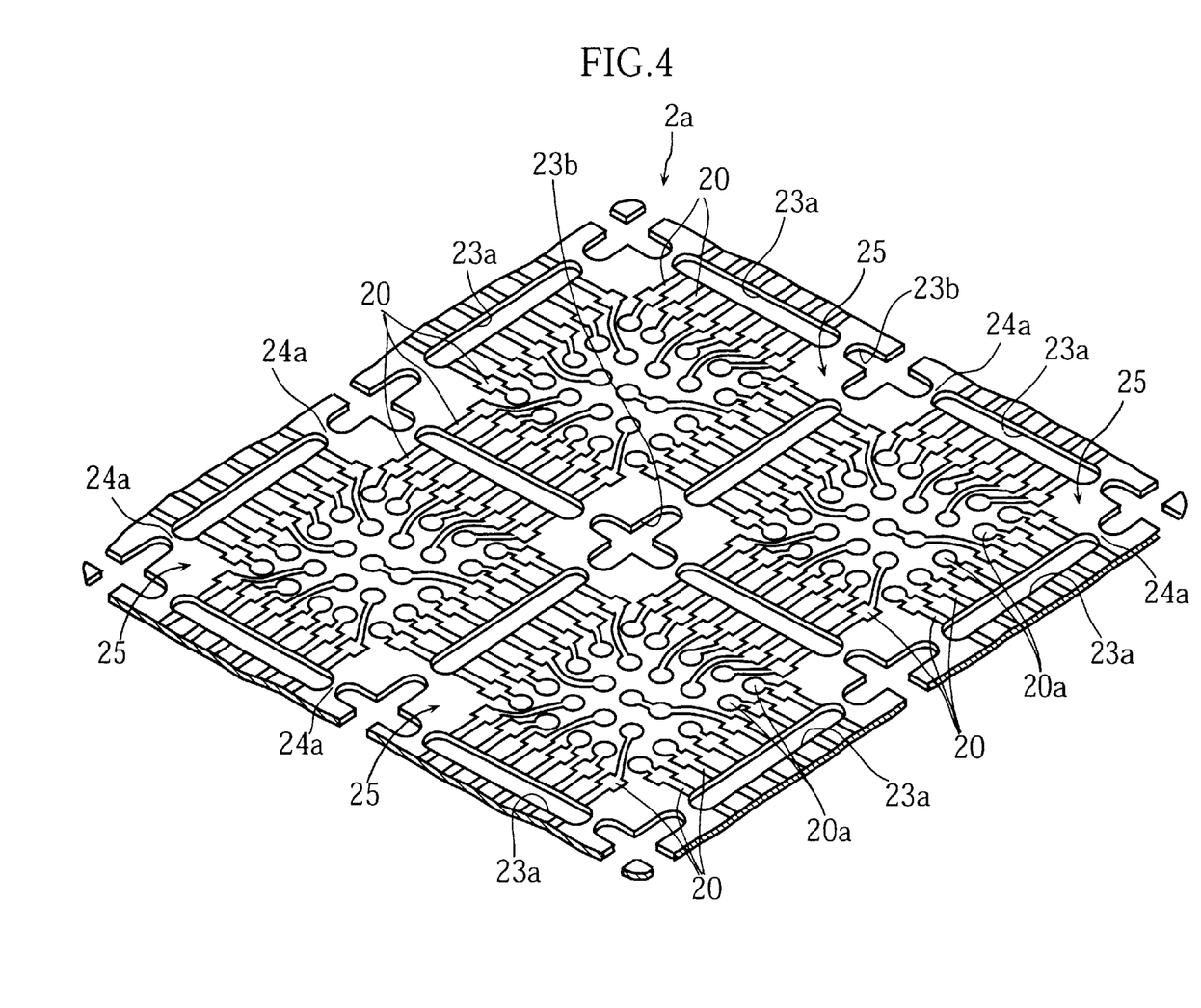
FIG. 4 is a perspective view showing part of a mother board used for making the semiconductor device of FIG. 1.
Figure 5:
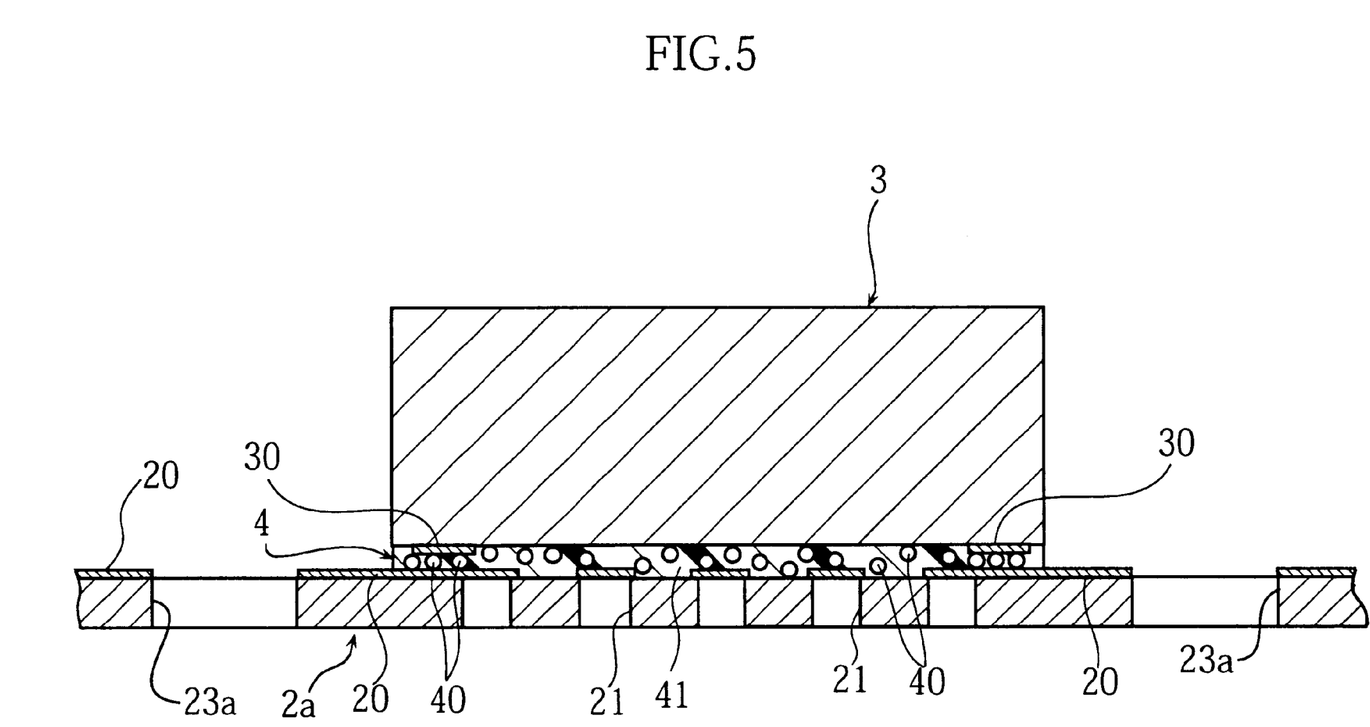
FIG. 5 is a sectional view showing a semiconductor chip provisionally attached to the mother board of FIG. 4.
Figure 6:
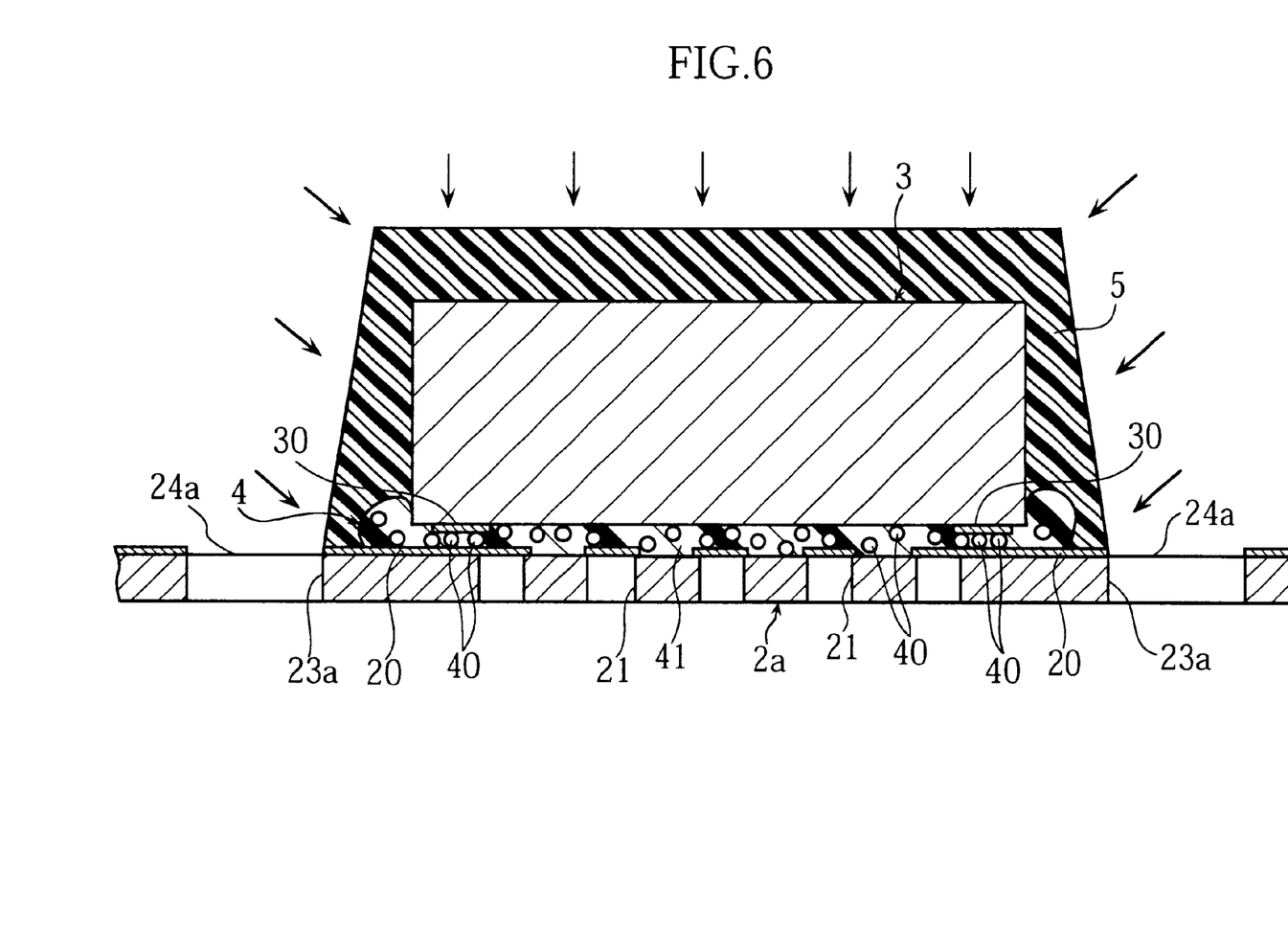
FIG. 6 is a sectional view showing the semiconductor chip enclosed by a protection package.

Referring to FIGS. 4–6, fabrication procedures of the semiconductor device 1 will be described below.

First, as shown in FIG. 4, a mother board 2a is prepared which is large enough to collectively produce a plurality of semiconductor devices. FIG. 4 shows only a part of the mother board 2a. In the illustrated embodiment, the mother board 2a is made of glass-fiber-reinforced resin. Instead, the mother board 2a may be a film-like supporting member made of a polyimide resin for example.

The mother board 2a is formed with elongated grooves 23a and cross-shaped grooves 23b. The elongated grooves 23a are arranged parallel or perpendicular to each other, while the cross-shaped grooves 23b are arranged in a grid-like array. The mother board 2a includes bridging portions 24a disposed between the elongated grooves 23a and the cross-shaped grooves 23b. The mother board 2a is divided into a plurality of rectangular regions 25 defined by the elongated grooves 23a and cross-shaped grooves 23b. In FIG. 4, four rectangular regions 25 are illustrated, each of which is provided with the same wiring pattern 20. Though not shown in FIG. 4, each rectangular region 25 is formed with through-holes (reference numeral 21 in FIG. 5) arranged in a grid-like array. These through-holes are upwardly closed by the connection pads 20a included in the wiring pattern 20.

As shown in FIG. 5, a semiconductor chip 3 provided with connection terminals 30 is placed in each rectangular region 25 of the mother board 2a with anisotropic conductive adhesive 4 applied therebetween. The conductive adhesive 4 is made up of an insulating resin material 41 containing conductive substances 40.

At the stage shown in FIG. 5, the adhesive 4 has not been caused to set permanently, so that the chip 3 is only provisionally attached to the mother board 2a. Such provisional fixation of the chip 3 is attained in the following manner. First, the conductive adhesive 4 in a solid state is disposed between the chip 3 and the mother board 2a. As seen from FIG. 5, the adhesive-applied portion of the mother board 2a is generally equal in area to the mounting surface of the chip 3. Then, the adhesive 4 is heated up to a predetermined temperature at which the adhesive 4 becomes softer (semi-solid or semi-fluid) but does not set permanently. Thus, the chip 3 is provisionally attached to the mother board 2a.

In this heating step, the chip 3 needs to be urged toward the mother board 2a, so that the insulating resin material 41 is displaced from between the connection terminals 30 of the chip 3 and the wiring pattern 20 of the mother board 2a. In this manner, an excess amount of the resin material 41 is caused to flow out of the gaps between the terminals 30 and the wiring pattern 20, whereby the terminals 30 and the wiring pattern 20 are properly connected to each other via the conductive substances 40 contained in the resin material 41. As a result of the urging of the chip 3 toward the mother board 2a, part of the adhesive 4 is squeezed out from between the bonding surface of the chip 3 and the mother board 2a to come into contact with the side surfaces of the chip 3, as shown in FIG. 6.

Then, as shown in FIG. 6, a protection package 5 of a thermosetting resin is formed to enclose the semiconductor chip 3 and the conductive adhesive 4. In this step, the conductive adhesive 4 is caused to solidify (i.e., permanently set) together with the resin material of the package 5, so that the chip 3 is secured to the mother board 2a.

The protection package 5 may be made by transfer molding using a mold or die formed with a suitably configured cavity. After the provisional attachment of the chip 3 to the mother board 2a, the chip 3 is accommodated in the cavity of the mold. Then, molten thermosetting resin (e.g. epoxy resin) is poured into the cavity of the mold while being constantly heated.

According to the transfer molding described above, the chip 3 is urged toward the mother board 2a by the pressure of the material resin poured into the cavity of the mold. Additionally, the chip 3 is also urged toward the board 2a by the contracting force (acting in the directions shown by arrows in FIG. 6) of the poured resin material heated to permanently set. Thus, conductive substances 40 in the adhesive 4 are collected selectively between the wiring pattern 20 and the connection terminals 30, while the excessive amount of the resin component 41 is advantageously driven away from the gaps between the wiring pattern 20 and the connection terminals 30. As a result, proper electrical connection is made between the pattern 20 and the terminals 30. After the protection package 5 has permanently set, the contraction of the package 5 continues as the heated thermosetting resin of the package 5 is cooling down to e.g. the room temperature.

According to the present invention, the adhesive 4 is brought into intimate contact with both the chip 3 and the mother board 2a by the contracting force of the protection package 5. Thus, the chip 3 is reliably attached to the mother board 2a. Further, the protection package 5, which urges the chip 3 toward the mother board 2a, is directly attached to the mother board 2a. Thus, the chip 3 is also fixed to the mother board 2a by the support of the protection package 5, which is directly attached to the mother board 2a.

When use is made of a film-like base member in place of the illustrated mother board 2a, it is preferable that the base member is reinforced, entirely or partially, for avoiding unfavorable warping of the base member and the protection package 5 when the material resin of the package 5 contracts. When the film-like base member is to be partially reinforced, at least chip-bonding regions of the base member are made stronger.

After the protection package 5 is formed, a plurality of ball-like solder terminals 6 are formed on the reverse side of the mother board 2a at the locations of the through-holes 21. To form the terminals 6, the mother board 2a of FIG. 6 may be turned over to facilitate the placing of solid solder balls at the through-holes 21. Then, upon heating, the solder balls will melt and flow into the through-holes 21 to be electrically connected to the connection pads 20a. Then, the semi-fluid solder material filling up the respective through-holes 21 is caused to cool down for solidification.

Finally, the mother board 2a is cut at the bridging portions 24a. Thus, individual semiconductor devices as shown in FIGS. 1–3 are obtained collectively.

Figure 7:
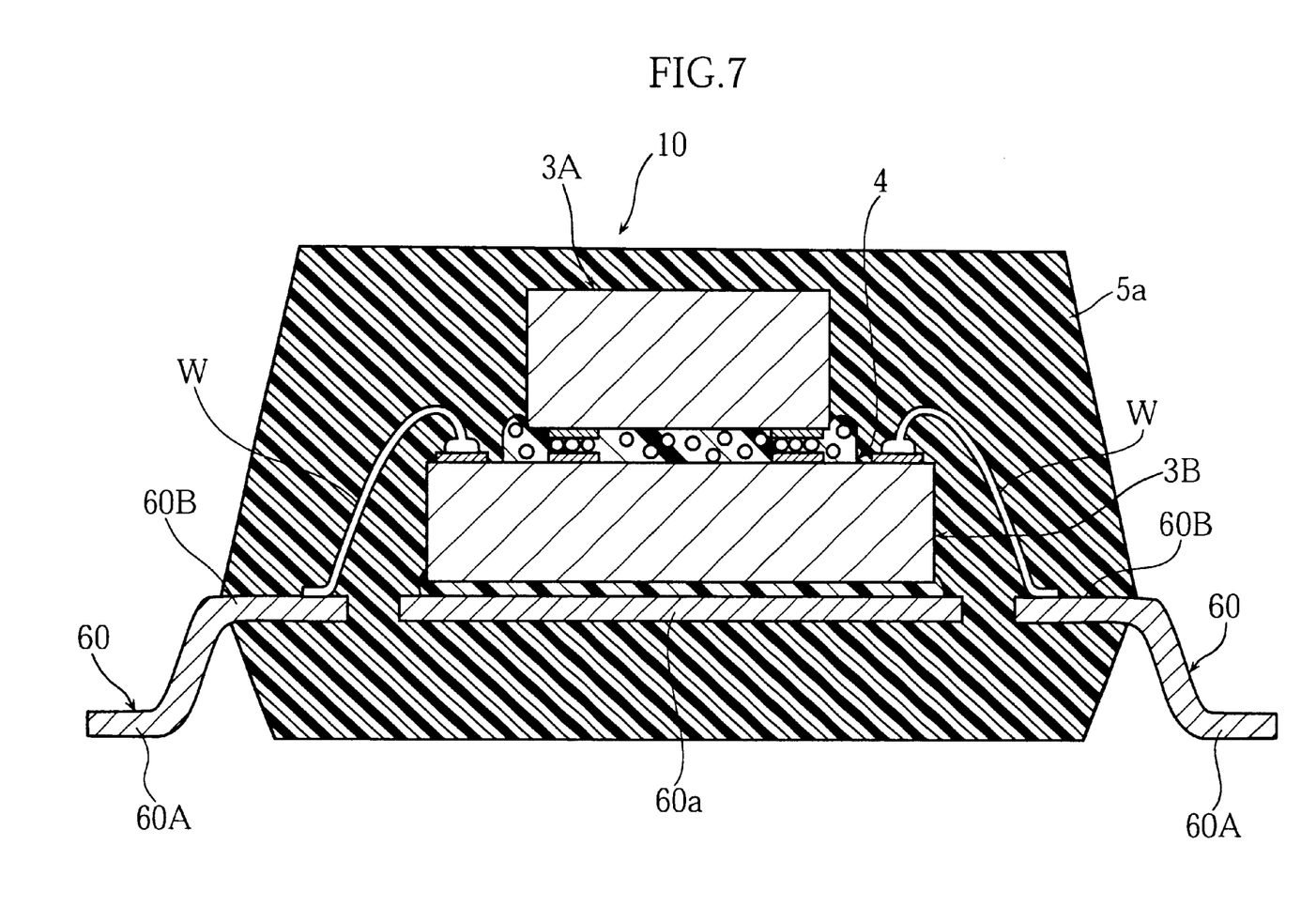
FIG. 7 is a sectional view showing a semiconductor device according to a second embodiment of the present invention.

Reference is now made to FIG. 7 illustrating a semiconductor device 10 according to a second embodiment of the present invention. The semiconductor device 10 includes a first (or upper) semiconductor chip 3A and a second (or lower) semiconductor chip 3B supporting the first semiconductor chip 3A. The first and the second chips 3A, 3B are electrically and mechanically connected to each other by anisotropic conductive adhesive 4. The first chip 3A, the second chip 3B and the conductive adhesive 4 are enclosed by a protection package 5a.

The semiconductor device 10 also includes a bonding pad 60a on which the second chip 3B is mounted, and two leads 60 electrically connected to the second chip 3B via connection wires W. Each lead 60 includes an outer portion 60A and an inner portion 60B. The outer portions 60A of the respective leads 60 protrude from the package 5a, while the inner portions 60B are enclosed by the package 5a.

As readily understood, the semiconductor device 10 of the second embodiment enjoys the same advantages as those obtainable in the semiconductor device 1 of the first embodiment.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A method of making a semiconductor device provided with a semiconductor chip, a base member and a protection package, the method comprising the steps of:

applying anisotropic conductive adhesive between the chip and the base member;

provisionally attaching the chip to the base member by rendering the adhesive semi-solid; and forming the protection package to enclose the chip and the adhesive;

wherein the adhesive is rendered solid at the protection package forming step for securing the chip to the base member.

2. The method according to claim 1, wherein the chip is urged toward the base member by contraction of the protection package.

3. The method according to claim 2, wherein the contraction occurs when the package solidifies and cools down.

4. The method according to claim 1, wherein the adhesive and the package contain a thermosetting resin material.

5. A semiconductor device comprising:

a semiconductor chip;

a base member for mounting the chip;

anisotropic conductive adhesive arranged between the chip and the base member; and a package for enclosing the chip and the adhesive;

wherein the chip is secured to the base member by the adhesive and the package.

6. The semiconductor device according to claim 5, wherein the package is held in direct contact with the base member.

7. The semiconductor device according to claim 5, wherein the chip is provided with at least one connection terminal, the base member being provided with at least one counterpart terminal held in facing relation to the connection terminal of the chip to be electrically connected thereto.

8. The semiconductor device according to claim 5, wherein the chip has a bonding surface and side surfaces connected to the bonding surface, the adhesive being held in contact with the bonding surface and a portion of each of the side surfaces.

9. The semiconductor device according to claim 5, wherein the base member is an insulating substrate.

10. The semiconductor device according to claim 9, wherein the insulating substrate is made of a glass-fiber-reinforced epoxy resin material.

11. The semiconductor device according to claim 9, wherein the insulating substrate is made of a ceramic material.

12. The semiconductor device according to claim 5, wherein the base member comprises a film element having a bonding area reinforced for mounting the chip.

13. The semiconductor device according to claim 5, wherein the base member comprises an additional semiconductor chip.

14. The semiconductor device according to claim 5, wherein the chip, the adhesive and the base member are embedded in the package.

15. The semiconductor device according to claim 5, wherein the adhesive comprises a thermosetting resin material containing conductive substances, the thermosetting resin material prior to permanent setting being less rigid than a portion of the base member on which the chip is mounted.

16. The semiconductor device according to claim 5, wherein the package is made of a thermosetting resin material which, prior to permanent setting, is less rigid than a portion of the base member on which the chip is mounted.

* * * * *